United States Patent

Yamada et al.

Patent Number: 5,974,336
Date of Patent: Oct. 26, 1999

[54] OXIDE SUPERCONDUCTOR AND METHOD OF MANUFACTURING THE SAME

[75] Inventors: Yasuji Yamada, Nagoya; Tamaki Masegi, Kawasaki; Junichi Kawashima, Nagoya; Yusuke Niiori, Inuyama; Izumi Hirabayashi, Nagoya, all of Japan

[73] Assignees: Kabushiki Kaisha Toshiba, Kawasaki; International Superconductivity Technology Center, Tokyo, both of Japan

[21] Appl. No.: 08/950,797

[22] Filed: Oct. 15, 1997

[30] Foreign Application Priority Data

Oct. 16, 1996 [JP] Japan .................................. 8-273192

[51] Int. Cl.$^6$ .......................... H01B 12/00; H01L 39/24
[52] U.S. Cl. .................. 505/230; 505/238; 505/239; 505/704; 505/434; 505/452; 428/930
[58] Field of Search .................................. 505/230, 238, 505/704, 239, 434, 452; 427/62; 428/930

[56] References Cited

U.S. PATENT DOCUMENTS

| 5,093,311 | 3/1992 | Shiota et al. .................................. 505/1 |
| 5,112,802 | 5/1992 | Takano et al. .................................. 505/1 |
| 5,411,938 | 5/1995 | Wu et al. . |
| 5,504,058 | 4/1996 | Tanaka et al. .......................... 505/234 |

FOREIGN PATENT DOCUMENTS

| 0 299 879 | 1/1989 | European Pat. Off. . |
| 0 334 352 | 9/1989 | European Pat. Off. . |
| 0 440 791 | 8/1991 | European Pat. Off. . |
| 0 561 617 | 9/1993 | European Pat. Off. . |
| 6-321964 | 11/1994 | Japan . |

OTHER PUBLICATIONS

Yuehai et al, International Journal of Modern Physics B, vol. 1, No. 2 (Jun. 1987) pp. 311–314.

Yoshio Masuda et al., Production of $YBa_2Cu_3O_{7-x}$ Thick Films Ag Metal Substrate Controlled by Oxygen. Jpn. Journal of Applied Physics. vol. 31, (1992) pp. 2709–2715. No Month Date is Available!.

S. F. Karmaneko et al., The formation of two-layered $YBa_2Cu_3O_{7-\delta}$ Superconducting films and their microwave surface resistance. Superscond.Sci.Technol. vol. 6, (1993) pp. 23–29. No Month Date is Available!.

Patent Abstracts of Japan, vol. 95, No. 2, Mar. 31, 1995, JP 06 321694, Nov. 22, 1994.

*Primary Examiner*—Roy V. King
*Attorney, Agent, or Firm*—Oblon, Spivak, McClelland, Maier & Neustadt, P.C.

[57] ABSTRACT

An oxide superconductor comprises a base material consisting of a single crystalline oxide, an oxide superconductor film consisting of a Y123 compound and formed on the single crystalline oxide base material, and a coating film consisting essentially of a Ba—Cu—O oxide and covering the surface of the oxide superconductor film, the coating film having a thermal expansion coefficient higher than that of the oxide superconductor film.

8 Claims, 2 Drawing Sheets

OXIDE SUPERCONDUCTOR AND METHOD OF MANUFACTURING THE SAME

BACKGROUND OF THE INVENTION

The present invention relates to an oxide superconductor and a method of manufacturing the same.

To allow an oxide superconductor to transport a large current, the oxide superconductor is required to be highly oriented to exhibit an electromagnetic anisotropy and to be less in grain boundary acting as a weak link. To meet these requirements, it was customary in the past to form an oxide superconductor film by vapor phase growth on an oriented oxide and/or metal substrate.

However, the deposition rate of the oxide superconductor film is considerably low in the vapor phase growing method, leading to a long time required for forming a film thick enough to transport a large current. In addition, the vapor phase growing method is known to bring about poor orientation and increased grain boundaries with increase in the thickness of the oxide superconductor film (Jpn. J. Appl. Phys. Vol. 31 (1992) pp.2709–2715 and Supercond. Sci. Technol. 8 (1993) pp.23–29, Printed in the UK). The vapor phase growing method is also known to give rise to cracks in the formed superconductor film, leading to breakage of the current path, with increase in the thickness of the film.

A measure for solving the above-noted problems is proposed in, for example, Japanese Patent Disclosure (Kokai) No. 6-321694. Specifically, it is proposed to form an oxide superconductor film on a substrate by liquid phase epitaxy. This method certainly permits forming a relatively thick oxide superconductor film, which is less in grain boundary, in a short time. However, it is impossible to eliminate completely the cracks occurring in the oxide superconductor film, leaving room for further improvement in the critical current density of the oxide superconductor film.

BRIEF SUMMARY OF THE INVENTION

An object of the present invention is to suppress the crack occurrence in an oxide superconductor film so as to improve the critical current density of the film.

According to an aspect of the present invention, there is provided an oxide superconductor, comprising a base material consisting of a single crystalline oxide, an oxide superconductor film formed on the oxide base material, and a coating film covering the surface of the oxide superconductor film, the coating film having a thermal expansion coefficient higher than that of the oxide superconductor film.

According to another aspect of the present invention, there is provided a method of manufacturing an oxide superconductor, comprising the steps of: forming an oxide superconductor film by a liquid phase growing method on a base material consisting of a single crystalline oxide; and forming a coating film by a melt solidifying method to cover the surface of the oxide superconductor film.

In the present invention, an oxide superconductor film is covered with a coating film having a thermal expansion coefficient higher than that of the oxide superconductor film, with the result that the crack occurrence in the oxide superconductor film is suppressed. It follows that there exists less grain boundaries which act as weak links, leading to an improved critical current density of the superconductor film.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
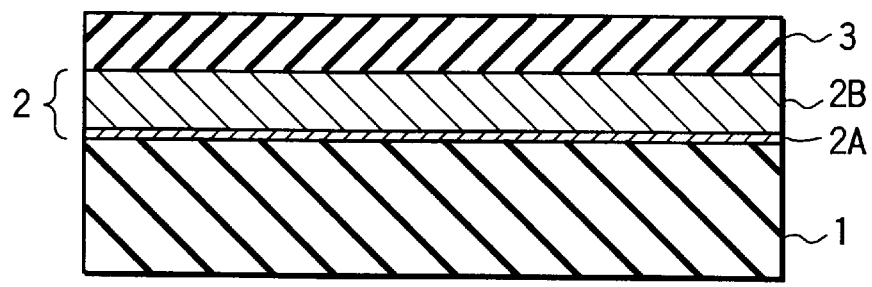
FIG. 1 is a cross sectional view showing the structure of an oxide superconductor obtained in Example 1.

The present invention provides an oxide superconductor, comprising a base material consisting of a single crystalline oxide, an oxide superconductor film formed on the oxide base material, and a coating film covering the surface of the oxide superconductor film.

In the present invention, a single crystalline oxide such as yttria-stabilized zirconia (YSZ) or $SrTiO_3$ can be used as a base material. The shape of the base material is not particularly limited in the present invention, that is, the base material can be in the form of, for example, a substrate or a fiber.

It is possible to use as an oxide superconductor a so-called "1-2-3 compound" represented by the general formula given below:

$$REBa_2Cu_3O_{6+x}$$

where RE denotes at least one element selected from the group consisting of Y and rare earth elements, and $0 < x \leq 1$. A specific example of the 1-2-3 compound is $YBa_2Cu_3O_{6+x}$, hereinafter referred to as "Y123".

An oxide containing Ba—Cu—O as a main component can be used as a coating material. It should be noted that the Ba—Cu—O oxide has a thermal expansion coefficient higher than that of Y123 crystal.

The oxide superconductor of the present invention can be manufactured as follows. In the first step, an oxide superconductor film, e.g., a Y123 film, is formed by a melt growing method on the surface of a single crystalline oxide base material. To be more specific, flux which consists of BaO, CuO, and so on and a raw material of an oxide superconductor such as Y211 compound are melted in a crucible. In this step, a melt of the raw material of the oxide superconductor is present in a bottom portion of the crucible, and a melt containing mainly a Ba—Cu—O oxide is present in an upper portion of the crucible. Under this condition, the base material is brought into contact with the melt to permit the Y123 compound, which is migrated through the melt, to be deposited on the base material to form a Y123 film. When the Y123 film has grown to have a desired thickness, the base material is moved away from the melt. In moving the base material away from the melt, the melt of the Ba—Cu—O based oxide is solidified to form a coating film. A homogeneous coating film can be obtained by controlling, for example, the temperature of the melt and the time required for moving the base material away from the melt. A homogeneous coating film can be formed in the case of using a fiber as a base material because the fiber has a relatively small diameter and a large surface area per unit volume and, thus, to a good cooling efficiency. Incidentally, formation of a coating film was not considered to be desirable in the past.

Where a coating film having a high thermal expansion coefficient is formed to cover the surface of an oxide superconductor film, e.g., Y123 film, as in the present invention, a compressive stress caused by shrinkage of the coating film acts on the oxide superconductor film so as to suppress crack occurrence in the oxide superconductor film.

EXAMPLES

Let us describe the present invention more in detail with reference to the accompanying drawings.

Example 1

FIG. 1 is a cross sectional view showing an oxide superconductor prepared in this Example. As shown in the drawing, an oxide superconductor film 2 consisting of a Y123 seed crystal 2A and a Y123 film 2B is formed on a substrate 1 consisting of a YSZ single crystal. Further, a coating film 3 consisting of an oxide containing a Ba—Cu—O oxide as a main component is formed to cover the upper surface of the oxide superconductor film 2. The coating film 3 has a thermal expansion coefficient higher than that of the oxide superconductor film 2.

The superconductor shown in FIG. 1 was prepared as follows. In the first step, a Y123 seed crystal 2A was formed in a thickness of about 100 to 200 nm by a pulsed laser deposition (PLD) technique on the substrate 1 consisting of YSZ having (100) plane on the surface. The seed crystal 2A was to be used as a seed in the subsequent step of depositing a Y123 film by liquid phase epitaxy (LPE). Then, 100 g of $YBa_2Cu_3O_{6+x}$, 65 g of BaO, 60 g of CuO, and 6 g of $BaF_2$ were loaded in an yttria crucible, followed by heating the crucible in an electric furnace to 800 to 1,000° C. so as to melt the materials. Under this condition, the substrate 1 was kept in contact for 10 minutes with the melt whose surface temperature was set at about 930° C. while rotating the substrate 1 at 100 rpm so as to deposit a Y123 film 2B in a thickness of 2 to 10 $\mu$m on the Y123 seed crystal 2A. Further, the substrate 1 was moved away from the melt surface while keeping the substrate 1 horizontal so as to solidify the oxide material containing as a main component a Ba—Cu—O oxide, thereby forming a coating film 3 in a thickness of about 0.1 to 0.5 mm. The resultant structure was taken out of the electric furnace and cooled to room temperature.

The resistance of the resultant sample between both ends of the YSZ substrate was found to be about 10Ω, supporting a relatively high electrical conductivity. This also supports that cracks did not occur in the Y123 film.

For comparison, a film structure was prepared by forming a Y123 seed crystal 2A and a Y123 film 2B on a YSZ substrate 1, but without forming a coating film. The structure was taken out of an electric furnace and cooled to room temperature. When the Y123 film 2B was observed with an optical microscope, cracks were found in the Y123 film. Further, the structure was subjected to a heat treatment at 500° C. for 100 hours under a flowing oxygen for imparting a superconductivity to the Y123 film. When the Y123 film was observed with an optical microscope, innumerable cracks were found in the film, supporting that cracks are increased after annealing under a flowing oxygen. Still further, according to measurement of magnetization with superconducting quantum interference device (SQUID), transition to superconducting state was found to take place in the Y123 film at 90K. However, when resistance between both ends of the YSZ substrate was measured at room temperature, current was not detected.

It has also been confirmed that, in the case of forming a coating film, cracks do not occur in the superconductor film even after annealing under a flowing oxygen.

Example 2

Figure 2:
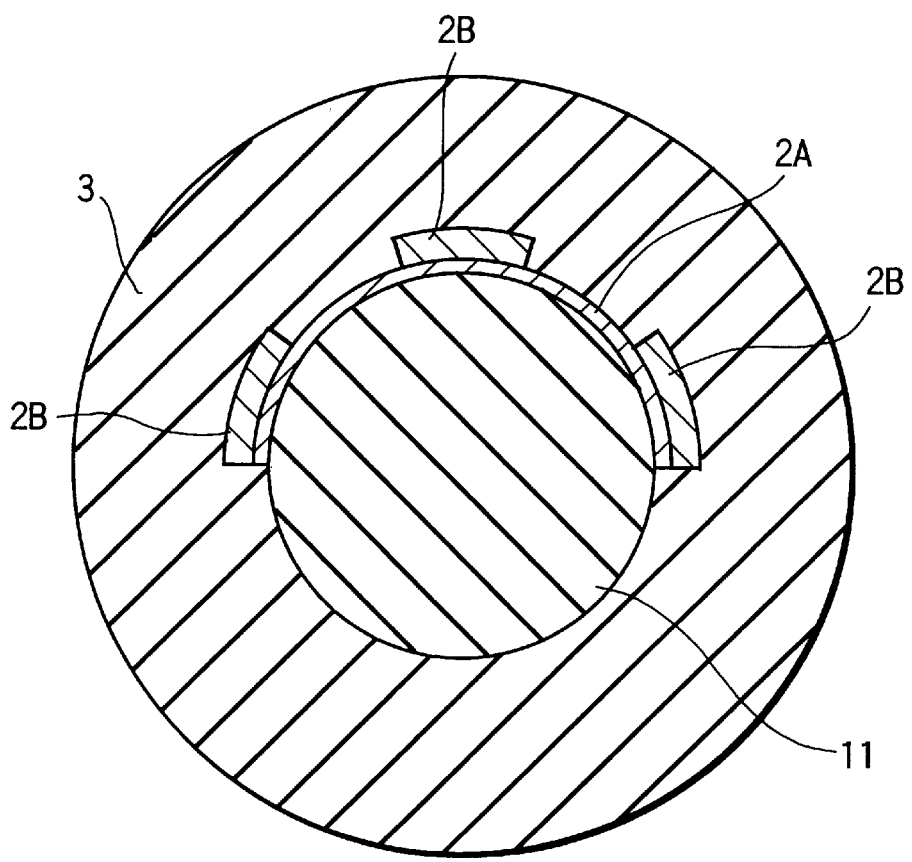
FIG. 2 is a cross sectional view showing the structure of an oxide superconductor obtained in Example 2.

FIG. 2 is a cross sectional view showing the oxide superconductor prepared in this Example. As shown in the drawing, a Y123 seed crystal 2A is formed to cover a half of the circumferential surface of a fiber 11 consisting of a YSZ single crystal. Also, a Y123 film 2B is formed on three regions of the Y123 seed crystal 2A. Further, a coating film 3 is formed to cover the entire surface of the fiber 11 including these oxide superconductor films. The fiber type oxide superconductor can be applied for a superconducting wire.

The fiber type oxide superconductor was prepared as follows. In the first step, the fiber 11 about 3 cm long was prepared by cutting a YSZ single crystal fiber about 22 cm in length and about 0.30 to 0.40 mm in diameter, which was prepared by laser pedestal growth technique using a $CO_2$ laser. The crystal orientation of the fiber was (100) or (110).

The Y123 seed crystal 2A was formed in a thickness of about 100 to 200 nm to cover a half of the circumferential surface of the fiber 11 by a pulsed laser deposition (PLD) technique as in Example 1. On the other hand, materials equal to those in Example 1 were loaded in an yttria crucible and melted by heating in an electric furnace to 800 to 1,000° C. Then, a holder made of a MgO single crystal and horizontally holding the fiber 11 at both ends of the fiber 11 was mounted to a lower end of a rotary shaft. Under this condition, the fiber 11 was brought into contact with the melt so as to permit growth of the Y123 film 2B on the Y123 seed crystal 2A while rotating the fiber 11 within a horizontal plane. In this step, the Y123 film 2B having a width of 50 to 100 $\mu$m and a thickness of 10 to 20 $\mu$m was found to grow on three regions of the Y123 seed crystal 2A. Then, the fiber 11 was moved upward away from the melt surface such that the fiber 11 was kept horizontal so as to allow the melt of the Ba—Cu—O based oxide to be solidified, thereby forming a coating film 3 having a thickness of about 100 to 200 $\mu$m and covering the entire surface of the fiber 11.

It should be noted that, if the fiber 11 is moved up slightly, the melt surface is upheaved by the surface tension of the melt so as to permit the melt to be kept in contact with the fiber. The upheaved portion of the melt is cooled to temperatures somewhat lower than the melting point of the melt. It follows that a temperature gradient is imparted to the upheaved portion of the melt in accordance with the height of the upheaval. In order to make the coating film 3 satisfactory, the fiber 11 is moved away from the melt surface such that the fiber 11 is kept in contact with the upheaved portion of the melt for 20 seconds to 2 minutes. During the procedure, the fiber temperature falls within a range between a level immediately below the melting point and 50° C. below the melting point of the melt. Also, it is desirable for the coating film 3 to have a thickness of at least 10 μm. If the thickness of the coating film 3 is less than 10 μm, which is substantially equal to or thinner than the oxide superconductor film, the coating film 3 fails to produce the effect of suppressing the crack occurrence in the oxide superconductor film. On the other hand, it is very difficult to form uniformly a coating film having a thickness exceeding 300 μm on the fiber surface.

The resistance of the resultant sample was found to be zero in the vicinity of 90K. Also, the critical current under the liquid nitrogen temperature was found to be about 1A.

Figure 3:
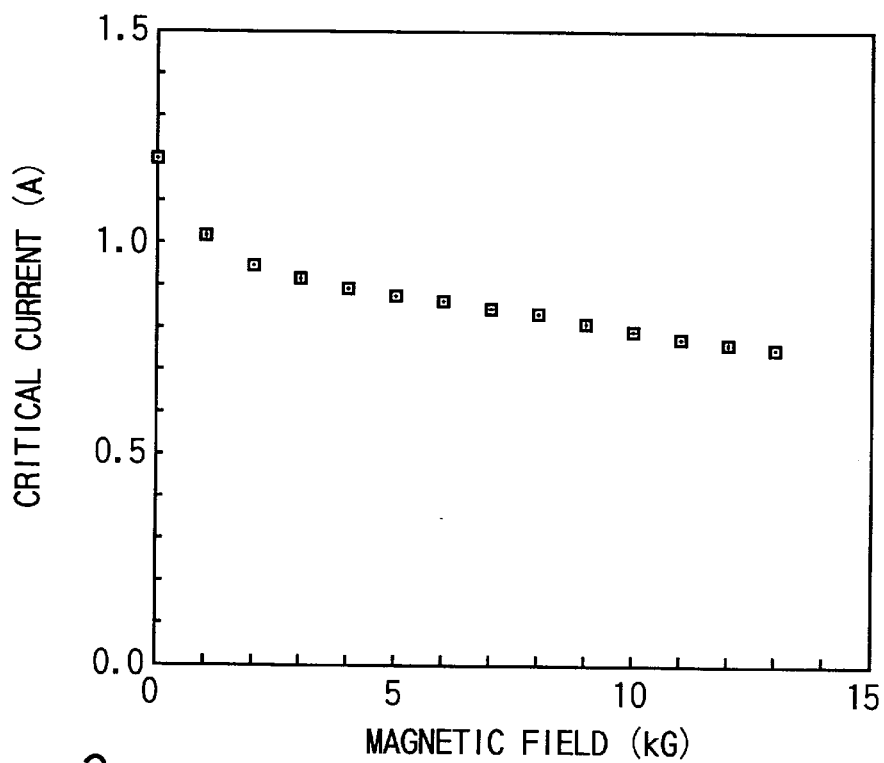
FIG. 3 is a graph showing the relationship between the magnetic field and critical current of an oxide superconductor obtained in Example 2.

FIG. 3 is a graph showing the relationship between the magnetic field and the critical current of the resultant Y123 film. As seen from the graph, the critical current is gradually decreased with increase in the magnetic field. This supports that a weak link is not produced between the superconducting grains, and that cracks do not occur in the Y123 film.

Figure 4:
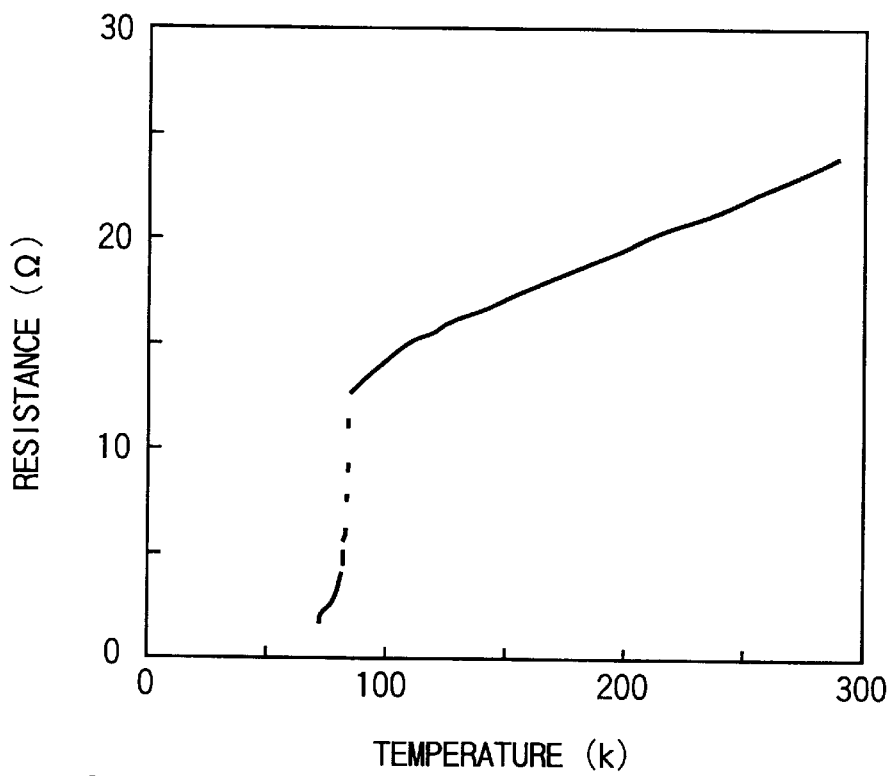
FIG. 4 is a graph showing the relationship between the temperature and resistance of an oxide superconductor of comparative example.

For comparison, a film structure was prepared by forming a Y123 film on a YSZ fiber, but without forming a coating film on the Y123 film. FIG. 4 is a graph showing the relationship between the temperature and the resistance of the resultant Y123 film. As shown in the graph, dropping of resistance accompanying the transition into a superconducting state is recognized in the vicinity of 90K. However, the Y123 film was found to exhibit a resistance of about 1Ω even at the boiling point of liquid nitrogen, and thus the critical current was zero. These experimental data are considered to support the crack occurrence in the Y123 film.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. An oxide superconductor, comprising:

a base material consisting of a single crystalline oxide;

an oxide superconductor film formed on said single crystalline oxide base material; and a coating film covering the surface of said oxide superconductor film, said coating film having a thermal expansion coefficient higher than that of the oxide superconductor film consisting essentially of a Ba—Cu—O oxide.

2. The oxide superconductor according to claim 1, wherein said coating film consisting essentially of a Ba—Cu—O oxide is prepared by a melt growth method from a flux.

3. The oxide superconductor according to claim 1, wherein said oxide superconductor film consists of a 1-2-3 compound represented by the general formula given below:

$$REBa_2Cu_3O_{6+x}$$

where RE denotes at least one element selected from the group consisting of Y and rare earth elements, and $0 < x \leq 1$.

4. The oxide superconductor according to claim 1, wherein said base material consists of yttria-stabilized zirconia or $SrTiO_3$.

5. The oxide superconductor according to claim 1, wherein said base material is in the form of a fiber.

6. A method of manufacturing an oxide superconductor comprising: a base material consisting of a single crystalline oxide;

an oxide superconductor film formed on said single crystalline oxide base material: and a coating film covering the surface of said oxide superconductor film, said coating film having a thermal expansion coefficient higher than that of the oxide superconductor film consisting essentially of a Ba—Cu—O oxide, comprising the steps of:

forming the oxide superconductor film by a liquid phase growing method on the base material consisting of the single crystalline oxide; and forming the coating film consisting essentially of the Ba—Cu—O oxide by a melt solidifying method to cover the surface of the oxide superconductor film.

7. The method according to claim 6, wherein:

said oxide superconductor film consists of a 1-2-3 compound represented by the general formula given below:

$$REBa_2Cy_3O_{6+x}$$

where RE denotes at least one element selected from the group consisting of Y and rare earth elements, and $0 < x \leq 1$.

8. The method according to claim 6, wherein said base material is in the form of a fiber.

* * * * *